(12) United States Patent
Chung (10) Patent No.: US 10,096,594 B2
(45) Date of Patent: Oct. 9, 2018

(54) DISPLAY PANEL AND DISPLAY DEVICE HAVING THE SAME

(71) Applicant: SAMSUNG DISPLAY CO., LTD., Yongin-si, Gyeonggi-do (KR)

(72) Inventor: Kyung-Hoon Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 160 days.

(21) Appl. No.: 15/136,591

(22) Filed: Apr. 22, 2016

(65) Prior Publication Data

US 2017/0062408 A1 Mar. 2, 2017

(30) Foreign Application Priority Data

Sep. 2, 2015 (KR) .......................... 10-2015-0124038

(51) Int. Cl.
*H01L 27/02* (2006.01)
*G09G 3/3225* (2016.01)
*G09G 3/3233* (2016.01)

(52) U.S. Cl.
CPC ....... *H01L 27/0296* (2013.01); *G09G 3/3225* (2013.01); *G09G 3/3233* (2013.01); *G09G 2300/0426* (2013.01); *G09G 2300/0852* (2013.01); *G09G 2310/0262* (2013.01); *G09G 2330/04* (2013.01); *H01L 27/0292* (2013.01)

(58) Field of Classification Search
CPC .............. G09G 3/3225; G09G 3/3233; G09G 2300/0426; G09G 2300/0852; G09G 2310/0262; G09G 2330/04; H01L 27/0296; H01L 27/3279
See application file for complete search history.

(56) References Cited

U.S. PATENT DOCUMENTS

2013/0107075 A1* 5/2013 Kobayashi ........ H01L 27/14636
348/222.1
2015/0235913 A1* 8/2015 In ........................ G02F 1/13458
257/48

FOREIGN PATENT DOCUMENTS

KR 10-2011-0013693 A 2/2011

* cited by examiner

*Primary Examiner* — Sahlu Okebato
(74) *Attorney, Agent, or Firm* — Lewis Roca Rothgerber Christie LLP (57) ABSTRACT

A display panel includes: an electrostatic discharge (ESD) protection circuit area in a peripheral area surrounding a display area including pixels, the ESD protection circuit area including ESD protection circuits; a fan-out area in the peripheral area, including fan-out lines to receive data signals and a first pad to receive a first global signal; a common line area between the ESD protection circuit area and the fan-out area, including a first common line extending lengthwise in a pixel row direction; a first transmission line connecting lengthwise from the first pad to the first common line to transmit the first global signal to the first common line; and first global signal lines extending lengthwise in a pixel column direction from the first common line to the display area to concurrently transmit the first global signal to the pixels. The first transmission line is wider than the first global signal lines.

20 Claims, 8 Drawing Sheets

DISPLAY PANEL AND DISPLAY DEVICE HAVING THE SAME

CROSS REFERENCE TO RELATED APPLICATION

This application claims priority to and the benefit of Korean Patent Application No. 10-2015-0124038, filed on Sep. 2, 2015 in the Korean Intellectual Property Office (KIPO), the entire content of which is herein incorporated by reference.

BACKGROUND

1. Field

Aspects of embodiments of the present invention relate to display devices. More particularly, aspects of embodiments of the present invention relate to display panels and display devices having the display panels.

2. Discussion of Related Art

A display device may include a display panel having an array substrate and an opposed substrate facing the array substrate. The display panel may include a display area for displaying an image and a peripheral area surrounding the display area. In the display area, switching elements and pixel electrodes may be formed. In the peripheral area, data and scan drivers to drive the switching elements and the pixel electrodes, and electrostatic discharge (ESD) protection diodes or ESD protection transistors disposed between the switching elements and the data and scan drivers may be formed. In a simultaneous emission driving method, the pixel electrodes may be simultaneously driven to display images.

SUMMARY

Some embodiments of the present invention provide for display devices. Further embodiments of the present invention provide for display panels driven by a simultaneous emission method and display devices having these display panels. Still further embodiments provide for a display panel that secures a sufficient width of a transmission line that transmits a global signal to a common line, and for a display device including the display panel.

According to an embodiment of the present invention, a display panel is provided. The display panel includes: an electrostatic discharge (ESD) protection circuit area at a side of a peripheral area surrounding a display area including a plurality of pixels, the ESD protection circuit area including a plurality of ESD protection circuits; a fan-out area at another side of the peripheral area, including a plurality of fan-out lines configured to receive data signals and a first pad configured to receive a first global signal; a common line area between the ESD protection circuit area and the fan-out area, including a first common line extending lengthwise in a first direction; a first transmission line connecting lengthwise from the first pad to the first common line to transmit the first global signal to the first common line; and a plurality of first global signal lines extending lengthwise in a second direction crossing the first direction from the first common line to the display area to concurrently transmit the first global signal to the pixels. A width of the first transmission line is greater than a width of the first global signal lines.

The first global signal lines may be arranged to transmit the first global signal to columns of the pixels.

The first direction may correspond to a pixel row direction and the second direction may correspond to a pixel column direction.

Each of the pixels may include first to third sub-pixels respectively connected to first to third data lines. Each of the fan-out lines may be connected to one of the first to third data lines. The first to third data lines may be configured to respectively transmit the data signals to the first to third sub-pixels of each of the pixels.

For each of the pixels, one of the first global signal lines may be between corresponding ones of the first and second data lines, or for each of the pixels, one of the first global signal lines may be between corresponding ones of the second and third data lines.

For each of the pixels, one of the first global signal lines may be adjacent to one of and not between corresponding ones of the first and third data lines.

The first transmission line may extend lengthwise in the second direction.

The fan-out area may further include a second pad configured to receive a second global signal. The common line area may further include a second common line extending lengthwise in the first direction and configured to receive the second global signal from the second pad.

The display panel may further include: a second transmission line connecting lengthwise from the second pad to the second common line to transmit the second global signal to the second common line; and a plurality of second global signal lines extending lengthwise in the second direction from the second common line to the display area to concurrently transmit the second global signal to the pixels. A width of the second transmission line may be greater than a width of the second global signal lines.

The second global signal lines may be arranged to transmit the second global signal to columns of the pixels.

Each of the pixels may include first to third sub-pixels respectively connected to first to third data lines. Each of the fan-out lines may be connected to one of the first to third data lines. The first to third data lines may be configured to respectively transmit the data signals to the first to third sub-pixels of each of the pixels.

For each of the pixels, one of the second global signal lines may be between corresponding ones of the first and second data lines, or for each of the pixels, one of the second global signal lines may be between corresponding ones of the second and third data lines.

For each of the pixels, one of the second global signal lines may be adjacent to one of and not between corresponding ones of the first and third data lines.

The first global signal may be configured to concurrently control a threshold voltage compensating operation of a driving transistor in each of the pixels. The second global signal may be configured to concurrently control emission of each of the pixels.

According to another embodiment of the present invention, a display panel is provided. The display panel includes: an electrostatic discharge (ESD) protection circuit area at a side of a peripheral area surrounding a display area including a plurality of pixels, the ESD protection circuit area including a plurality of ESD protection circuits; a fan-out area at another side of the peripheral area, including a plurality of fan-out lines configured to receive data signals and to transmit the data signals to a corresponding plurality of data lines extending lengthwise in a second direction, and a pad configured to receive a global signal; a common line area between the ESD protection circuit area and the fan-out area, including a first common line extending lengthwise in a first direction crossing the second direction, a plurality of switching elements each connected to a corresponding one of the data lines, a second common line extending lengthwise in the first direction and configured to transmit the global signal to the switching elements to concurrently control the switching elements, and a plurality of global signal lines connecting lengthwise in the second direction from the first common line to the second common line to transmit the global signal to the second common line; and a transmission line connecting lengthwise from the pad to the first common line to transmit the global signal to the first common line. A width of the transmission line is greater than a width of the global signal lines and a width of the data lines.

The global signal lines may be arranged to correspond to columns of the pixels.

The first direction may correspond to a pixel row direction and the second direction may correspond to a pixel column direction.

The switching elements may be located between the first common line and the second common line.

The global signal may be configured to control transmitting of a voltage to the data lines. The data lines may be configured to transmit the voltage to the pixels to reset the pixels.

According to yet another embodiment of the present invention, a display device is provided. The display device includes: a display panel having a display area including a plurality of pixels, and a peripheral area surrounding the display area; a scan driver configured to provide scan signals to the pixels; a data driver configured to provide data signals to the pixels; a control line driver configured to provide a global signal to the pixels; and a controller configured to control the scan driver, the data driver, and the control line driver. The peripheral area includes: an electrostatic discharge (ESD) protection circuit area at a side of the peripheral area and including a plurality of ESD protection circuits; a fan-out area at another side of the peripheral area, including a plurality of fan-out lines configured to receive the data signals and a pad configured to receive the global signal; a common line area between the ESD protection circuit area and the fan-out area, including a common line extending lengthwise in a pixel row direction; a transmission line connecting lengthwise from the pad to the common line to transmit the global signal to the common line; and a plurality of global signal lines extending lengthwise in a pixel column direction from the common line to the display area to concurrently transmit the global signal to the pixels. A width of the transmission line is greater than a width of the global signal line.

A display panel according to the above and other embodiments of the present invention may include a common line (or common line area) for transmitting a global signal in the pixel row direction between a fan-out area and an ESD protection circuit area and through global signal lines such that a margin (or available space) for a transmission line may be secured. Accordingly, a width of the transmission line for transmitting the global signal to the common line may be increased. For example, the width of the transmission line may be greater (wider), such as three or more times greater, than a width of each of the global signal lines. Therefore, line resistance of the transmission line may be reduced and heat in the fan-out area or the inlets of the display panel may be reduced. In addition, a display device may include the display panel so that reliability may increase.

BRIEF DESCRIPTION OF THE DRAWINGS

Embodiments of the present invention may be understood in more detail from the following description taken in conjunction with the accompanying drawings, in which.

DETAILED DESCRIPTION

Example embodiments of the present invention will be described more fully hereinafter with reference to the accompanying drawings. In the drawings, the same or like reference numerals refer to the same or like elements throughout. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

In a simultaneous emission driving method, a display panel may include signal lines to which global signals concurrently (e.g., simultaneously) controlling a plurality of pixels (such as all of the pixels) are supplied. When the global signal lines are added to a peripheral area of the display panel, the peripheral area may take on a more complicated structure.

In addition, an ESD protection circuit area including diodes or the like may be disposed in the peripheral area, such as in the outermost portion of the peripheral area. The ESD protection circuit area may take up a relatively large portion of the peripheral area such that the space available to dispose the signal lines becomes narrower and widths of the signal lines for transmitting the global signals become relatively small. Accordingly, heat at inlets of the display panel may increase so that inner circuits of the display panel may be destroyed. Thus, reliability of a display device including such a display panel may decrease. Embodiments of the present invention address these and other concerns.

Figure 1:
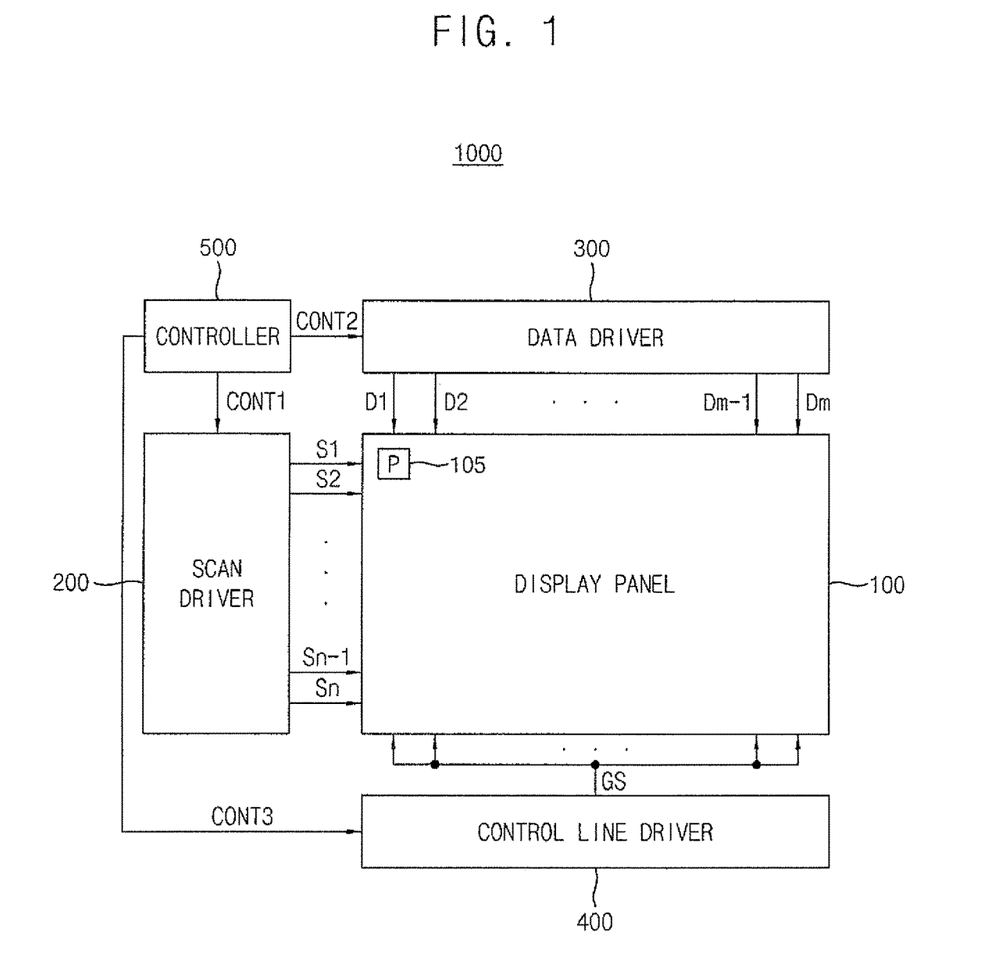
FIG. 1 is a block diagram of an example display device according to an embodiment of the present invention.

FIG. 1 is a block diagram of an example display device 1000 according to an embodiment of the present invention.

Referring to FIG. 1, the display device 1000 may include a display panel 100, a scan driver 200, a data driver 300, a control line driver 400, and a controller 500. In some embodiments, the display device may display images using a Simultaneous Emission with Active Voltage (SEAV) driving method. Accordingly, a single frame may include an emission period and a non-emission period, and a plurality of pixels 105 (for example, all of the pixels 105) may concurrently (e.g., simultaneously) emit light during the emission period. The SEAV driving method may be controlled by one or more global signals that are concurrently (e.g., simultaneously) supplied to all of the pixels 105.

The display panel 100 may display images. The display panel 100 may include an array substrate and an opposed substrate facing the array substrate. The display panel 100 may include a display area DA including the plurality of pixels 105 and a peripheral area PA surrounding the display area DA (see FIG. 2). The pixels 105 may be connected to a plurality of scan lines S1 to Sn, a plurality of data lines D1 to Dm, and a plurality of global lines GS.

Figure 3:
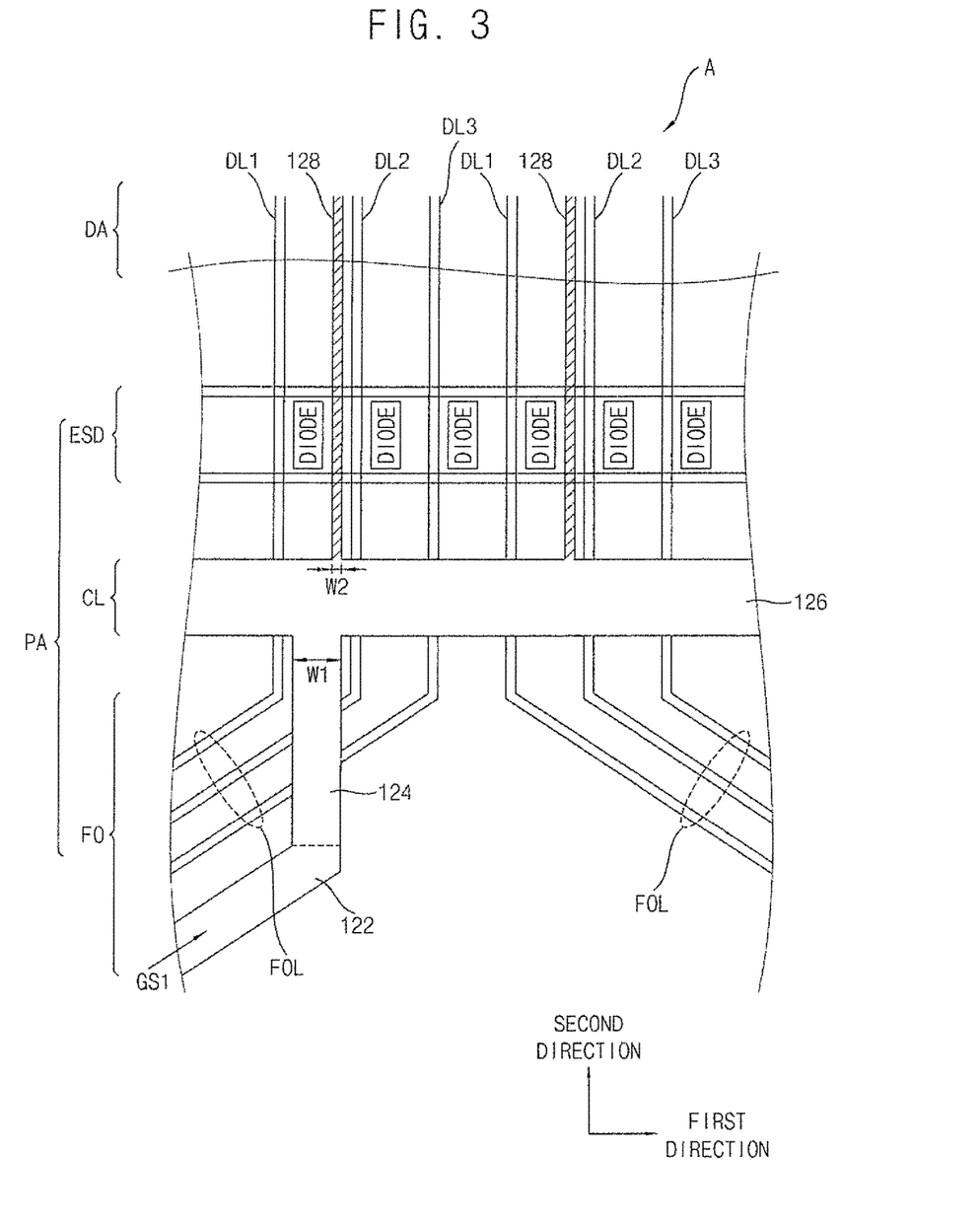
FIG. 3 is a layout diagram illustrating an example of area A of the display panel of FIG. 2 according to an embodiment of the present invention.

With reference to FIG. 3, the peripheral area PA may include an electrostatic discharge (ESD) protection circuit area (that includes a plurality of ESD protection circuits, such as diodes) at a side of the peripheral area PA (such as an inner side or a side bordering the display area DA), a fan-out area FO at another side of the peripheral area PA (such as an outer side or a side outside the ESD protection circuit area) and including a plurality of fan-out lines FOL configured to receive data signals and a first pad 122 configured to receive a first global signal GS1, and a common line area CL between the ESD protection circuit area and the fan-out area FO, including a first common line 126 extended lengthwise in a first (e.g., pixel row) direction, a first transmission line 124 connected lengthwise from the first pad 122 to the first common line 126 to transmit the first global signal GS1 to the first common line 126, and a plurality of first global signal lines 128 extended lengthwise from the first common line 126 to the display area DA in a second (e.g., pixel column) direction to concurrently (e.g., simultaneously) provide the first global signal GS1 to the pixels 105 (such as to columns of the pixels 105).

Here, a width W1 of the first transmission line 124 is greater (such as three or more times greater) than a width W2 of the first global signal lines 128. Thus, heat at inlets of the display panel 100 to which the global signals are supplied may be reduced so that reliability of the display panel 100 may be improved.

The controller 500 may receive input control signals and input image signals from an image source such as an external graphics apparatus. The controller 500 may generate data signals that may be a digital type and correspond to operating conditions of the display panel 100 based on the input image signals, and may provide the data signals to the data driver 300. In addition, the controller 500 may generate first control signals CONT1 for driving the scan driver 200, second control signals CONT2 for driving the data driver 300, and third control signals CONT3 for driving the control line driver 400. The controller 500 may output the first to third control signals CONT1, CONT2, and CONT3 to the scan driver 200, the data driver 300, and the control line driver 400, respectively.

The scan driver 200 may sequentially or concurrently (e.g., simultaneously) provide scan signals to the scan lines S1 to Sn in each frame based on the first control signals CONT1 received from the controller 500. The data driver 300 may convert the data signals received from the controller 500 into data signals (or data voltages) of an analog type based on the second control signals CONT2 received from the controller 500. The data driver 300 may provide the data signals to the data lines D1 to Dm.

The control line driver 400 may provide the global signals to the global signal lines GS in each frame based on the third control signals CONT3 received from the controller 500. The global signals may be concurrently (e.g., simultaneously) supplied to the whole pixel area (e.g., all of the pixels 105). In some embodiments, the global signal lines GS may be arranged in a set or predetermined pixel column spacing. In some embodiments, the global signals may correspond to signals for concurrently (e.g., simultaneously) controlling a threshold voltage compensating operation of a plurality of driving transistors in the pixels 105 or an emission control signal for concurrently (e.g., simultaneously) controlling emission of the pixels 105.

In some embodiments, the global signals may be generated in the controller 500 and provided to the display panel 100. In other embodiments, the control line driver 400 may be included in the controller 500. For example, a signal generator for generating the global signals may be in the controller 500 instead of the control line driver 400.

The arrangement of components of the display device 1000 is not limited to the example embodiment of FIG. 1. In other embodiments, for example, the control line driver 400 may be between the data driver 300 and the display panel 100, and the control lines GS may enter the display panel 100 from the same side as the data lines D1 to Dm.

Figure 2:
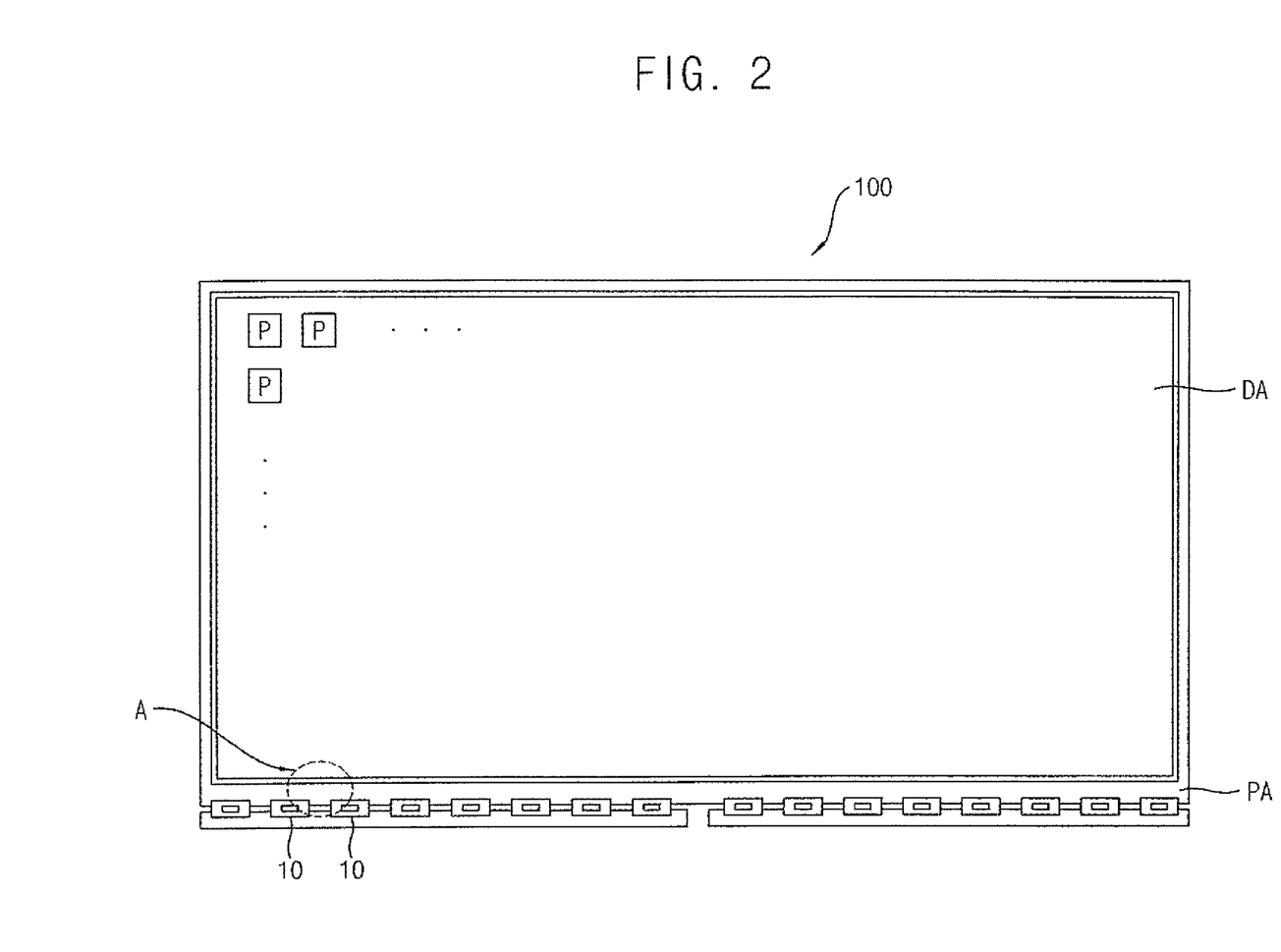
FIG. 2 is a layout diagram of an example display panel according to an embodiment of the present invention.

FIG. 2 is a layout diagram of an example display panel 100 according to an embodiment of the present invention.

Referring to FIG. 2, the display panel 100 may include a display area DA for displaying images and a peripheral area PA surrounding the display area DA. A plurality of pixels P (such as the pixels 105 of FIG. 1) may be in the display area DA. The pixels P may form a plurality of pixel rows and pixel columns. In some embodiments, each of the pixels P may include first to third sub-pixels.

The first to third sub-pixels may emit red light, green light, and blue light, respectively, and may be driven by a corresponding set of data lines DL1, DL2, and DL3 for each of the data lines D1 to Dm of FIG. 1 (e.g., a multiplexor may direct each of the data lines D1 to Dm to a corresponding set of the three data lines DL1, DL2, and DL3). In other embodiments, m may be a multiple of three and each of the different sets of the data lines DL1, DL2, and DL3 may correspond to three different ones of the data lines D1 to Dm. For ease of description, the data lines will hereinafter be described as being in multiple groups of the three data lines DL1, DL2, and DL3.

The display panel 100 may include an array substrate and an opposed substrate facing the array substrate. In some embodiments, at least one driving chip 10 may be mounted on the peripheral area PA of the array substrate as a Chip-On-Film (COF) type or a Chip-On-Glass (COG) type. For example, the driving chip 10 may include at least one of a data driver, a scan driver, and a control line driver (such as a data driver and a control line driver). Here, signal lines of the driving chip 10 may be arranged in the peripheral area PA. For example, the signal lines may transmit data signals, global signals, power voltages, etc., to the pixels P.

In some embodiments (and with reference to FIG. 3), the peripheral area PA may include an electrostatic discharge (ESD) protection circuit area, a fan-out area FO outside the ESD protection area (e.g., the ESD protection circuit area may be between the display area DA and the fan-out area FO), and a common line area CL between the ESD protection area and the fan-out area FO. Constructions of the peripheral area PA will be described in further detail with reference to FIGS. 3, 4, 6, 8, and 9.

FIG. 3 is a layout diagram illustrating an example of area A of the display panel of FIG. 2 according to an embodiment of the present invention.

Referring to FIG. 3, a peripheral area PA of the display panel 100 may include an ESD protection circuit area (ESD), a fan-out area FO, and a common line area CL. In addition, a first transmission line 124 and a plurality of first global signal lines 128 may be disposed in the peripheral area PA. FIG. 3 shows an enlarged part A of the display panel 100 of FIG. 2.

The ESD protection circuit area may include ESD protection circuits (such as diodes) disposed at a side of the peripheral area PA (such as an inside of the peripheral area PA, such as adjacent to the display area DA). The ESD protection circuits may prevent a pulse potential due to, for example, electrostatic discharge from being input to internal circuits such as the pixels. In some embodiments, the ESD protection circuits may include diodes. The diodes may be turned on to prevent the pulse potential from being input when the pulse potential is generated. Since the ESD protection circuit area includes the plurality of diodes, a space in which other signal lines (e.g., global signal lines) may be arranged may be less than outside of the ESD protection circuit area (e.g., in other portions of the peripheral area PA). Thus, a width of signal lines (such as the first global signal lines 128) in the ESD protection circuit area may be narrower than outside of the ESD protection circuit area.

The fan-out area FO may be outside of the ESD protection circuit area (e.g., at an outer side of the peripheral area PA). The fan-out area FO may include a plurality of fan-out lines FOL to which data signals are supplied and a first pad 122 to which a first global signal GS1 is supplied from a control line driver (such as control line driver 400 of FIG. 1). The fan-out lines FOL may transmit data signals from a data driver (such as data driver 300 of FIG. 1) to sets of data lines DL1, DL2, and DL3, also referred to as the first to third data lines DL1, DL2, and DL3, each of the fan-out lines FOL being connected to a corresponding one of the first to third data lines DL1, DL2, and DL3.

The first to third data lines DL1, DL2, and DL3 may be respectively connected to first to third sub-pixels (such as red, green, and blue sub-pixels). In some embodiments, the first global signal GS1 may correspond, for example, to a signal for concurrently (e.g., simultaneously) controlling a threshold voltage compensating operation of a plurality of driving transistors in the pixels (e.g., a compensation global signal GC in FIG. 5) or an emission control signal for concurrently (e.g., simultaneously) controlling emission of the pixels (e.g., an emission global signal GE in FIG. 7).

The common line area CL may be between the ESD protection circuit area and the fan-out area FO (e.g., with the ESD protection circuit area being between the display area DA and the common line area CL). The common line area CL may include a first common line 126 extended in a first direction. In some embodiments, the first direction may correspond to the pixel row direction. Here, the first common line 126 may transmit the first global signal GS1 in the pixel row direction (e.g., in the first direction). In some embodiments, the first direction may correspond to a pixel column direction and the first common line 126 may transmit the first global signal GS1 in the pixel column direction.

The first transmission line 124 may be connected between the first common line 126 and the first pad 122. The first transmission line 124 may transmit the first global signal GS1 from the first pad 122 to the first common line 126. Here, the first common line 126 may be located outside of the ESD protection circuit area such that a margin (or available space) for arrangement of the first transmission line 124 may be secured. Accordingly, a width W1 of the first transmission line 124 for transmitting the first global signal GS1 to the first common line 126 may be increased. Thus, the width W1 of the first transmission line 124 may be greater (wider, such as three or more times wider) than a width W2 of the first global signal lines 128 that are extended from the first common line 126. In some embodiments, the first transmission line 124 may extend in the second direction.

When the first direction corresponds to the pixel row direction, the second direction may correspond to the pixel column direction. In contrast, when the first direction corresponds to the pixel column direction, the second direction may correspond to the pixel row direction. In some embodiments, the first transmission line 124 may be connected to a driving chip including the control line driver.

The first global signal lines 128 may extend from the first common line 126 to the display area DA to concurrently (e.g., simultaneously) provide the first global signal GS1 to the pixels. The first global signal lines 128 may be arranged in a set or predetermined pixel column spacing, such as every pixel pitch. Here, a direction in which the first global signal lines 128 extend may be substantially parallel to a direction in which the first transmission line 124 extends. For example, the first global signal lines 128 may extend in the pixel column direction when the first transmission line 124 extends in the pixel column direction.

In some embodiments, as illustrated in FIG. 3, each pixel may include the first to third sub-pixels connected to respective first to third data lines DL1, DL2, and DL3. The first global signal lines 128 may be arranged in every pixel column. However, this is an example, and in other embodiments, the first global signal lines 128 may be arranged in every two or three pixel columns, such as every pixel pitch (e.g., every group of first to third sub-pixels respectively connected to the first to third data lines DL1 to DL3).

In some embodiments, the first global signal lines 128 may be between the first data line DL1 and the second data line DL2 or between the second data line DL2 and the third data line DL3 each pixel pitch. FIG. 3 shows that the first global signal lines 128 are between the first and second data lines DL1 and DL2. In some embodiments, the first global signal lines 128 may be located outside of the first to third data lines DL1, DL2, and DL3 within a pixel pitch, such as adjacent to the first or third data line DL1 or DL3, but not between the first and third data lines DL1 and DL3.

The first global signal lines 128 may have a relatively narrow width due to the diodes and circuit elements included in the ESD protection circuit area. Thus, the width W1 of the first transmission line 124 may be greater than the width W2 of the first global signal lines 128. For example, the width W1 of the first transmission line 124 may be three times or more greater (or wider) than the width W2 of the first global signal lines 128.

As described above, the first common line 126 (e.g., the common line area CL) for transmitting the first global signal GS1 in the pixel row direction may be between the ESD protection circuit area and the fan-out area FO. Thus, the width W1 of the first transmission line 124 for transmitting the first global signal GS1 from the driving chip to the first global signal lines 128 may be increased. Accordingly, the width W1 of the first transmission line 124 may be greater than the width W2 of the first global signal lines 128. Therefore, line resistance of the first transmission line 124 may be reduced and heat at the inlets of the display panel or the fan-out area FO may be reduced. Thus, reliability of the display device may be improved.

Figure 4:
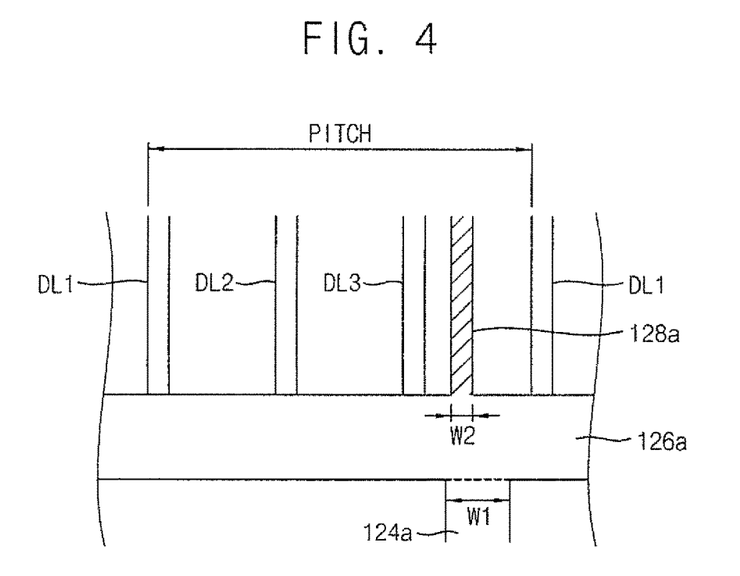
FIG. 4 is a layout diagram illustrating an example first global signal line in the display panel of FIG. 3 according to an embodiment of the present invention.

FIG. 4 is a layout diagram illustrating an example first global signal line 128a in the display panel of FIG. 3 according to an embodiment of the present invention.

Referring to FIG. 4, the first global signal line 128a may extend in a direction (e.g., a pixel column direction) from a first common line 126a to a display area (such as display area DA of FIG. 3). FIG. 4 shows a portion of a common line area (such as common line area CL of FIG. 3) corresponding to a pixel pitch (PITCH), or distance between pixels (or groups of three sub-pixels) in the pixel row direction.

In some embodiments, the first global signal line 128a may be located outside of the first to third data lines DL1, DL2, and DL3 (e.g., adjacent to one of, but not between both of, the first and third data lines DL1 and DL3) within the pixel pitch (e.g., separation in the pixel row direction between a group of sub-pixels corresponding to the first to third data lines DL1, DL2, and DL3 constituting each pixel). For example, as illustrated in FIG. 4, the first global signal line 128a may be disposed on the right side of the third data line DL3 within the pixel pitch.

In other embodiments, the first global signal line 128a may be disposed on the left side of the first data line DL1 within the pixel pitch. Here, the first common line 126a may be in an outer area with respect to the ESD protection circuit area so that a width W1 of the first transmission line 124 may be increased (e.g., compared to that of the first global signal line 128a). Thus, line resistance and heat at the inlets of the display panel or the fan-out area FO may be reduced. In some embodiments, the first global signal lines 128a may be arranged in a set or predetermined pixel column spacing, such as every pixel pitch.

Figure 5:
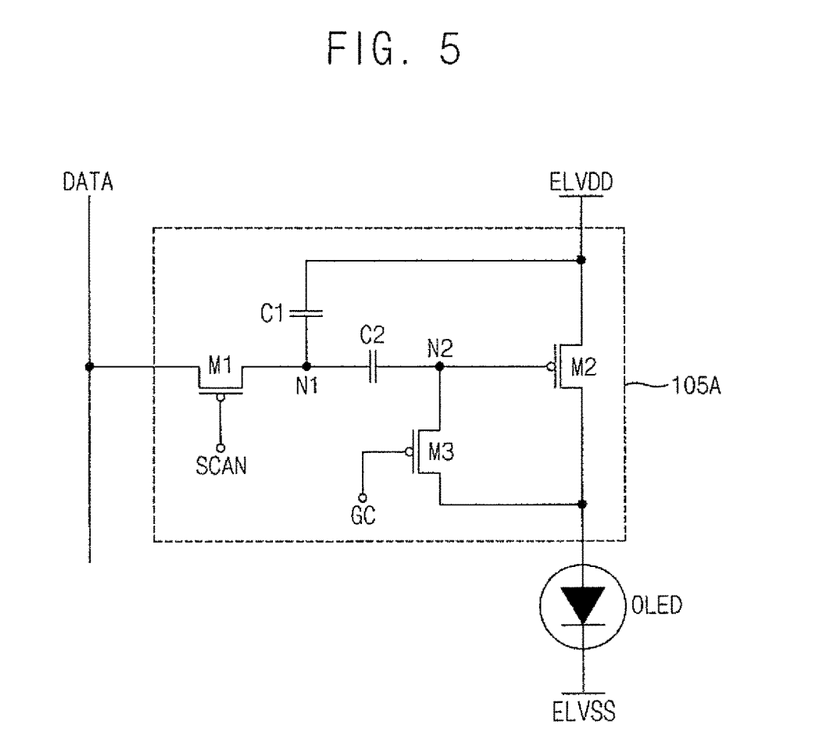
FIG. 5 is a circuit diagram illustrating an example pixel in the display panel of FIG. 3 according to an embodiment of the present invention.

FIG. 5 is a circuit diagram illustrating an example pixel in the display panel of FIG. 3 according to an embodiment of the present invention.

Referring to FIGS. 3 and 5, the pixel (or a sub-pixel) may include an organic light emitting diode (OLED) and a pixel circuit 105A for providing current to the OLED.

An anode of the OLED may be connected to the pixel circuit 105A and a cathode of the OLED may be connected to a second power voltage ELVSS. The OLED may emit light having a certain luminance corresponding to the current from the pixel circuit 105A.

In some embodiments, the pixel circuit 105A may include first to third transistors M1 to M3 and first and second capacitors C1 and C2. The first transistor M1 may include a gate electrode connected to a scan line, a first electrode connected to a data line, and a third electrode connected to a first node N1. Accordingly, a scan signal (SCAN) may be supplied to the gate electrode of the first transistor M1 and a data signal (DATA) may be supplied to the first electrode of the first transistor M1.

The second transistor M2 may include a gate electrode connected to a second node N2, a first electrode connected to a first power voltage ELVDD, and a second electrode connected to the anode of the OLED. Here, the second transistor M2 may perform a function as a driving transistor.

The first capacitor C1 may be connected between the first node N1 and the first electrode of the second transistor M2. The second capacitor C2 may be connected between the first node N1 and the second node N2.

The third transistor M3 may include a gate electrode connected to a first global signal line, a first electrode connected to the gate electrode of the second transistor M2, and a second electrode connected to the anode of the OLED. Accordingly, a compensation global signal GC (e.g., the first global signal GS1 of FIG. 3) may be supplied to the gate electrode of the third transistor M3. The second transistor M2 may be diode connected when the third transistor M3 is turned on by the compensation global signal GC. Thus, a threshold voltage of the driving transistor (i.e., the second transistor M2) may be compensated by the compensation global signal GC. Here, the compensating operation or the emitting operation may be performed concurrently (e.g., simultaneously) on all of the pixels (or sub-pixels) in each frame.

Figure 6:
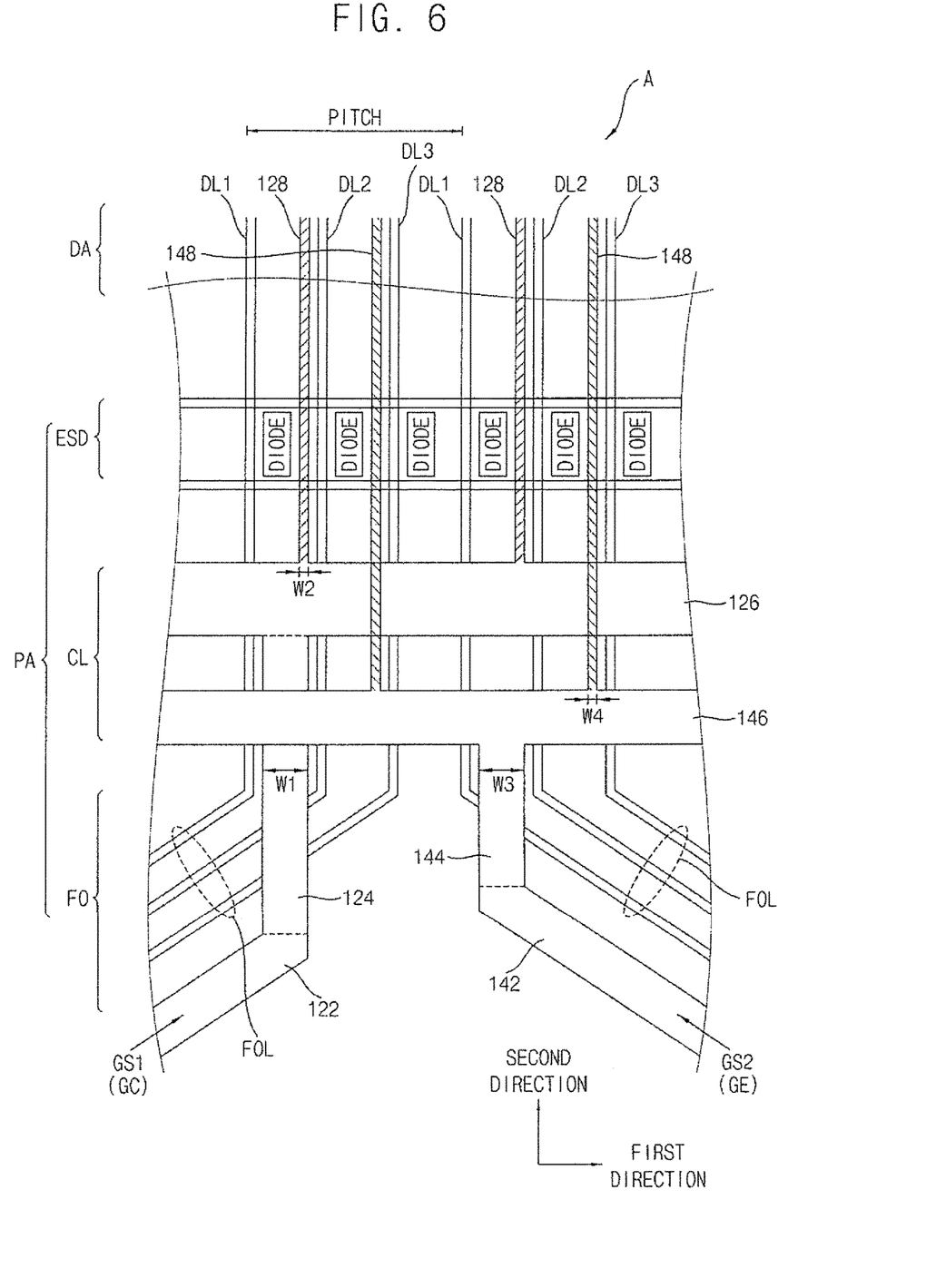
FIG. 6 is a layout diagram illustrating an example of area A of the display panel of FIG. 2 according to another embodiment of the present invention.

FIG. 6 is a layout diagram illustrating an example of area A of the display panel of FIG. 2 according to another embodiment of the present invention.

The peripheral area PA of the display panel of FIG. 6 is substantially the same as the peripheral area PA of the display panel described above with reference to FIG. 3 except for constructions of the common line area CL and the signal lines providing the global signals. Thus, the same or similar reference numerals will be used to refer to the same or like parts as those described in FIG. 3, and duplicate descriptions concerning the above elements may not be repeated.

Referring to FIG. 6, the peripheral area PA of the display panel 100 may include an ESD protection circuit area, a fan-out area FO, and a common line area CL. In addition, first and second transmission lines 124 and 144, and first and second global signal lines 128 and 148 may be disposed in the peripheral area PA. FIG. 6 shows an enlarged part A of the display panel 100 of FIG. 2.

The ESD protection circuit area may include ESD protection circuits (e.g., diodes) disposed at a side of the peripheral area PA (e.g., at an inside of the peripheral area PA, such as adjacent to the display area DA). Since the ESD protection circuit area may include a plurality of diodes, the space in which other signal lines are arranged may be less than outside of the ESD protection circuit area. Thus, the width of signal lines (such as the first and second global signal lines 128 and 148) in the ESD protection circuit area may be narrower than outside of the ESD protection circuit area.

The fan-out area FO may be outside of the ESD protection circuit area (such as an outer area of the peripheral area, such that the ESD protection circuit area is between the display area DA and the fan-out area FO). The fan-out area FO may include a plurality of fan-out lines FOL to which data signals are supplied, the first pad 122 to which a first global signal GS1 is supplied from a control line driver, and the second pad 142 to which a second global signal GS2 is supplied from the control line driver.

Figure 7:
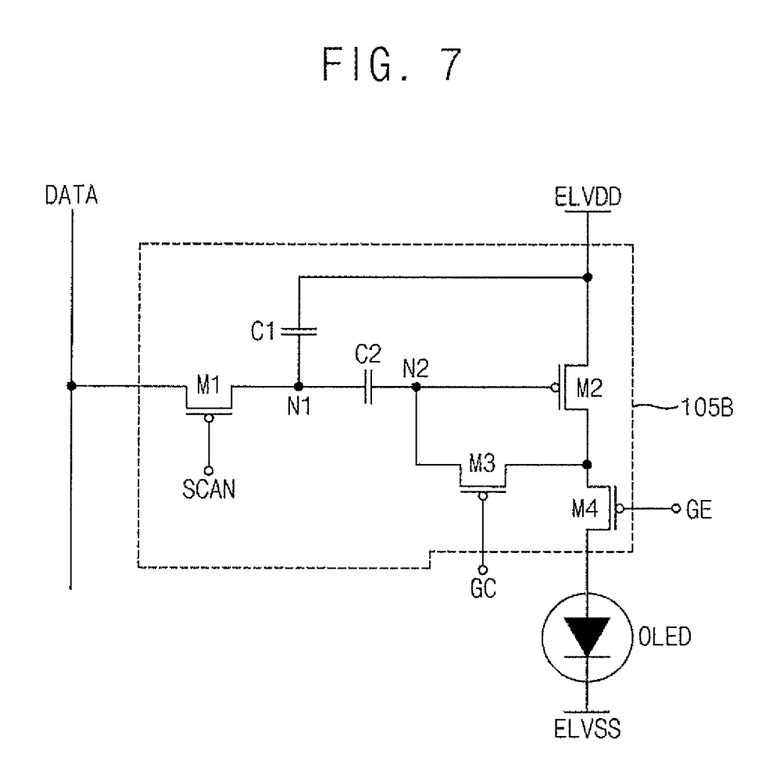
FIG. 7 is a circuit diagram illustrating an example pixel in the display panel of FIG. 6 according to an embodiment of the present invention.

In some embodiments, the first global signal GS1 may correspond to a signal for concurrently (e.g., simultaneously) controlling a threshold voltage compensating operation of a plurality of driving transistors in the pixels (e.g., a compensation global signal GC in FIG. 7), and the second global signal GS2 may correspond to an emission control signal for concurrently (e.g., simultaneously) controlling emission of the pixels (e.g., an emission global signal GE in FIG. 7). In some embodiments, the first global signal GS1 may correspond to the emission control signal for concurrently (e.g., simultaneously) controlling emission of the pixels (e.g., the emission global signal GE in FIG. 7), and the second global signal GS2 may correspond to the signal for concurrently (e.g., simultaneously) controlling a threshold voltage compensating operation of a plurality of driving transistors in the pixels (e.g., the compensation global signal GC in FIG. 7).

The common line area CL may be between the ESD protection circuit area and the fan-out area FO. The common line area CL may include a first common line 126 extended in a first direction and a second common line 146 parallel to the first common line 126 (e.g., also extended in the first direction). In some embodiments, the first common line 126 may transmit the first global signal GS1 received from the first pad 122 in the pixel row direction (e.g., in the first direction), and the second common line 146 may transmit the second global signal GS2 received from the second pad 142 in the pixel row direction.

The first transmission line 124 may be connected between the first common line 126 and the first pad 122. The first transmission line 124 may transmit the first global signal GS1 from the first pad 122 to the first common line 126. The second transmission line 144 may be connected between the second common line 146 and the second pad 142. The second transmission line 144 may transmit the second global signal GS2 from the second pad 142 to the second common line 146.

Here, the first and second common lines 126 and 146 may be located outside of the ESD protection circuit area such that a margin (or available space) for arrangement of the first and second transmission lines 124 and 144 may be secured. Accordingly, widths W1 and W3 of the first and second transmission lines 124 and 144 for transmitting the first and second global signals GS1 and GS2 to the first and second common lines 126 and 146 may be increased compared with comparable display panels. Thus, the widths W1 and W3 of the first and second transmission lines 124 and 144 may be greater (wider) than widths W2 and W4 of the first and second global signal lines 128 and 148.

The first global signal lines 128 may extend from the first common line 126 to the display area DA to concurrently (e.g., simultaneously) provide the first global signal GS1 to the pixels. The first global signal lines 128 may be arranged in a set or predetermined pixel column spacing, such as one every pixel pitch. The second global signal lines 148 may extend from the second common line 146 to the display area DA to concurrently (e.g., simultaneously) provide the second global signal GS2 to the pixels. The second global signal lines 148 may be arranged in a set or predetermined pixel column spacing, such as one every pixel pitch.

In some embodiments, as illustrated in FIG. 6, each pixel may include the first to third sub-pixels connected to respective first to third data lines DL1, DL2, and DL3. The first and second global lines 128 and 148 may be arranged in every pixel column. As illustrated in FIG. 6, the first global signal line 128 may be between the first data line DL1 and the second data line DL2, and the second global signal line 148 may be between the second data line DL2 and the third data line DL3.

In some embodiments, the first global signal lines 128 or the second global signal lines 148 may be located outside of the first to third data lines DL1 to DL3 within a pixel pitch (e.g., adjacent to one of, but not between both of, the first and third data lines DL1 and DL3). The first and second global signal lines 128 and 148 may have relatively narrow widths due to the diodes or other circuit elements included in the ESD protection circuit area. Thus, the widths W1 and W3 of the first and second transmission lines 124 and 144 may be greater (such as three or more times greater) than the widths W2 and W4 of the first and second global signal lines 128 and 148.

Accordingly, since the first and second common lines 126 and 146 (e.g., the common line area CL) may be located outside of the ESD protection circuit area in the peripheral area PA of the display panel 100, the widths W1 and W3 of the first and second transmission lines 124 and 144 for transmitting the first and second global signals GS1 and GS2 from the driving chip to the first and second global signal lines 128 and 148 may be increased (e.g., compared to the widths of the first and second global signal lines 128 and 148).

FIG. 7 is a circuit diagram illustrating an example pixel in the display panel of FIG. 6 according to an embodiment of the present invention.

The pixel of FIG. 7 is substantially the same as the pixel described above with reference to FIG. 5 except for constructions of a fourth transistor M4 for receiving an emission global signal GE. Thus, the same or similar reference numerals will be used to refer to the same or like parts as those described in FIG. 5, and duplicate descriptions concerning the above elements may not be repeated.

Referring to FIG. 7, the pixel (or a sub-pixel) may include an OLED and a pixel circuit 105B for providing current to the OLED. In some embodiments, the pixel circuit 105B may include first to fourth transistors M1 to M4 and first and second capacitors C1 and C2.

The third transistor M3 may include a gate electrode connected to a first global signal line, a first electrode connected to the gate electrode of the second transistor M2, and a second electrode connected to the anode of the OLED. Accordingly, a compensation global signal GC (e.g., the first global signal GS1 of FIG. 3 and FIG. 6) may be supplied to the gate electrode of the third transistor M3. The second transistor M2 may be diode connected when the third transistor M3 is turned on by the compensation global signal GC. Thus, a threshold voltage of the driving transistor (i.e., the second transistor M2) may be compensated by the compensation global signal GC.

The fourth transistor M4 may include a gate electrode connected to a second global signal line, a first electrode connected to a second electrode of the second transistor M2, and a second electrode connected to the anode of the OLED. An emission global signal GE (e.g., the second global signal GS2 of FIG. 6) may be supplied to the gate electrode of the fourth transistor M4. The pixel may emit light when the fourth transistor M4 is turned on. Here, the compensating operation or the emitting operation may be performed concurrently (e.g., simultaneously) on all of the pixels (or sub-pixels) in each frame.

Figure 8:
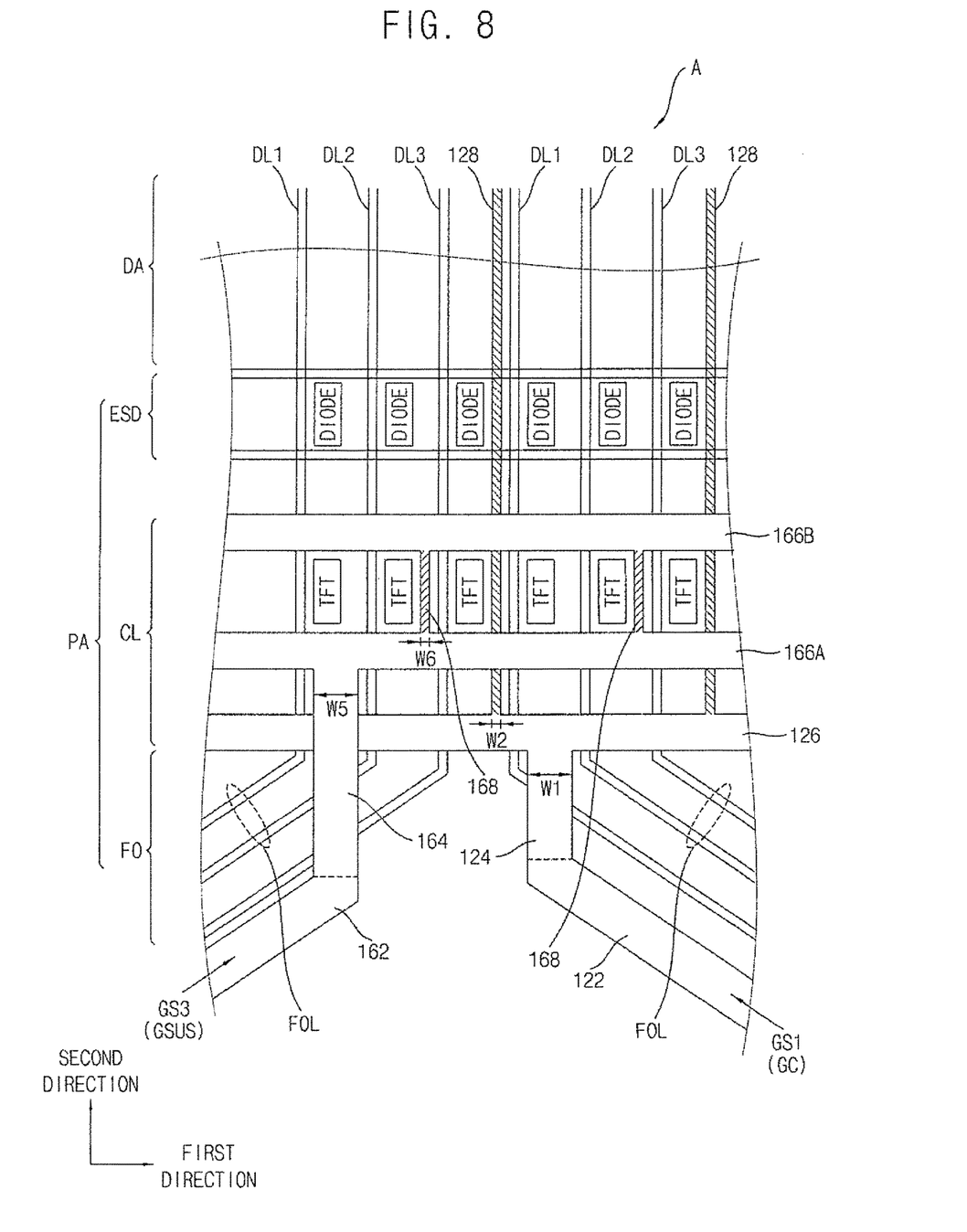
FIG. 8 is a layout diagram illustrating an example of area A of the display panel of FIG. 2 according to yet another embodiment of the present invention.
Figure 9:
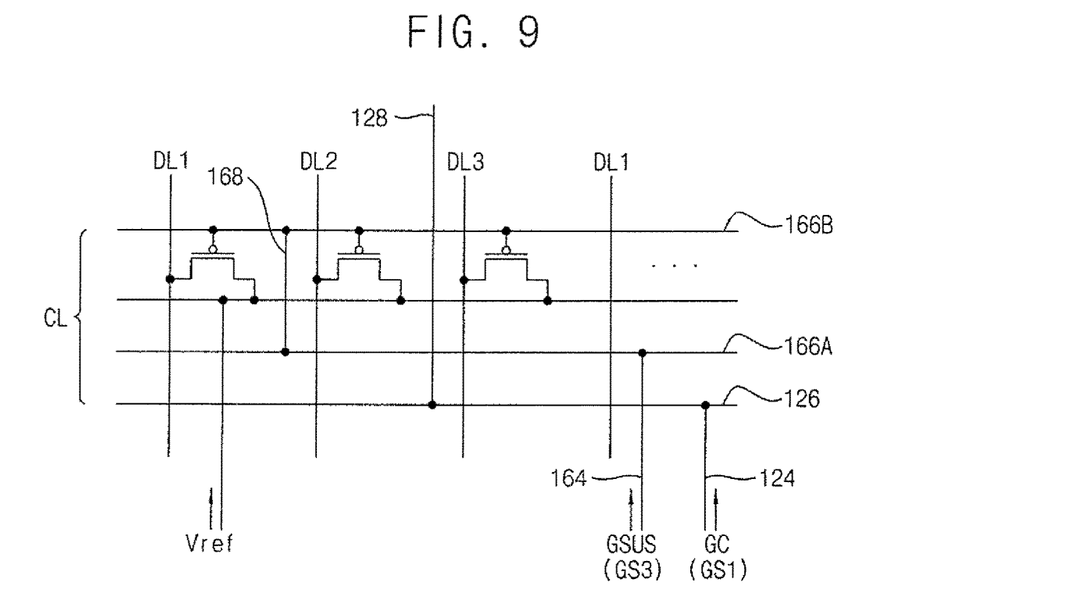
FIG. 9 is a circuit diagram illustrating an example common line area of the display panel of FIG. 8 according to an embodiment of the present invention.

FIG. 8 is a layout diagram illustrating an example of area A of the display panel of FIG. 2 according to yet another embodiment of the present invention. FIG. 9 is a circuit diagram illustrating an example common line area CL of the display panel of FIG. 8 according to an embodiment of the present invention.

The peripheral area PA of the display panel of FIG. 8 is substantially the same as the peripheral area PA of the display panel described above with reference to FIG. 3 and FIG. 6 except for constructions of the common line area CL and the signal lines providing global signals. Thus, the same or similar reference numerals will be used to refer to the same or like parts as those described with reference to FIG. 3 and FIG. 6, and duplicate descriptions concerning the above elements may not be repeated.

Referring to FIGS. 8 and 9, the peripheral area PA of the display panel 100 may include an ESD protection circuit area, a fan-out area FO, and a common line area CL. In addition, first and third transmission lines 124 and 164, and first and third global signal lines 128 and 168 may be disposed in the peripheral area PA. FIG. 8 shows an enlarged part A of the display panel 100 of FIG. 2.

The ESD protection circuit area may include ESD protection circuits (such as diodes) disposed at a side of the peripheral area PA (e.g., an inside of the peripheral area PA, such as adjacent to the display area DA).

The fan-out area FO may be outside of the ESD protection circuit area (such as an outer area of the peripheral area PA, such that the ESD protection circuit area is between the display area DA and the fan-out area FO). The fan-out area FO may include a plurality of fan-out lines FOL to which data signals are supplied, a first pad 122 to which the first global signal GS1 is supplied from the control line driver, and a third pad 162 to which the third global signal GS3 is supplied from the control line driver. In some embodiments, the first global signal GS1 may correspond to a signal for concurrently (e.g., simultaneously) controlling a threshold voltage compensating operation of a plurality of driving transistors in the pixels (e.g., a compensation global signal GC in FIG. 10).

The third global signal GS3 (e.g., a reset global signal GSUS in FIG. 10) may control transmitting a set or predetermined voltage (such as a reference voltage) to the data lines. The voltage may be supplied to the pixels via the first to third data lines DL1 to DL3 to reset the pixels. In the display device operated in the SEAV driving method, all of the pixels may be concurrently (e.g., simultaneously) reset during a reset period within a frame. The third global signal GS3 may control a timing of the reset period. Here, remaining voltages in the pixel circuits due to data signals supplied in a previous frame may be changed to a set or predetermined reference voltage (e.g., a reset voltage or a reference voltage Vref of FIGS. 9 and 10) in the reset period of a present frame. A signal line transmitting the reset voltage Vref is illustrated in FIG. 9.

The common line area CL may be between the ESD protection circuit area and the fan-out area FO. The common line area CL may include a first common line 126 extending lengthwise in a first direction (e.g., a pixel row direction) for providing the first global signal GS1 to the first global signal lines 128, a third common line 166A extending lengthwise in the first direction, a plurality of switching elements TFT each connected to a corresponding one of first to third data lines DL1 to DL3, a fourth common line 166B for providing the third global signal GS3 to the switching elements TFT to concurrently (e.g., simultaneously) control the switching elements TFT (e.g., the third global signal GS3 may function as a gate signal to each of the switching elements TFT), and a plurality of interconnection lines (or third global signal lines) 168 connected lengthwise in the second direction (e.g., a pixel column direction) from the third common line 166A to the fourth common line 166B to transmit the third global signal to the fourth common line 166B.

A width W5 of the third transmission line 164 may be increased compared with transmission lines of comparable display panels. The width W5 of the third transmission line 164 may be greater (such as three or more times greater) than a width W6 of the third global signal lines 168 and a width of the first to third data lines DL1 to DL3 (that, for example, may have a same or substantially the same width W6 as the third global signal lines 168).

In some embodiments, the third global signal lines 168 may be arranged in a set or predetermined pixel column spacing, such as every pixel pitch. The third global signal lines 168 may transmit the third global signal GS3 from the third common line 166A to the fourth common line 166B. In some embodiments, the first direction may correspond to a pixel row direction, and the third transmission line 164 may extend in a second direction corresponding to a pixel column direction. In some embodiments, the switching elements TFT may be located between the third common line 166A and the fourth common line 166B, and the third common line 166A may be substantially parallel to the fourth common line 166B. In some embodiments, the switching elements TFT may transmit a voltage (such as a reference voltage Vref) to corresponding ones of the data lines DL1 to DL3 (e.g., to initialize or reset the pixels) under control of the third global control signal GS3 (e.g., that may function as a gate signal to the switching elements TFT).

In some embodiments, as illustrated in FIGS. 3 and 8, the display panel may further include first global signal lines 128 to transmit the first global signal GS1 (e.g., a compensation global signal GC in FIGS. 8 and 9) to the pixels. The first global signal GS1 may concurrently (e.g., simultaneously) control a threshold voltage compensating operation of a plurality of driving transistors in the pixels. Since the first pad 122, the first transmission line 124, the first common line 126, and the first global signal lines 128 for providing the first global signal GS1 to the pixels are described above with reference to FIGS. 3 to 7, duplicate descriptions may not be repeated.

As illustrated in FIG. 9, the switching elements may control transmitting the reset voltage Vref to the first to third data lines DL1 to DL3. Each of the switching elements may include a gate electrode connected to the fourth common line 166B. The third global signal GS3 may be supplied from the third transmission line 164 to the third common line 166A, and the third global signal GS3 may be transmitted to the fourth common line 166B from the third global signal lines 168 connected between the third common line 166A and the fourth common line 166B.

Accordingly, the first, third, and fourth common lines 126, 166A, and 166B (e.g., the common line area CL) may be located outside of the ESD protection circuit area such that the widths W1 and W5 of the first and third transmission lines 124 and 164 transmitting the first and third global signals GS1 and GS3 from the driving chips to the first and third global signal lines 128 and 168 may be increased (e.g., compared to those of the first and third global signal lines 128 and 168).

Figure 10:
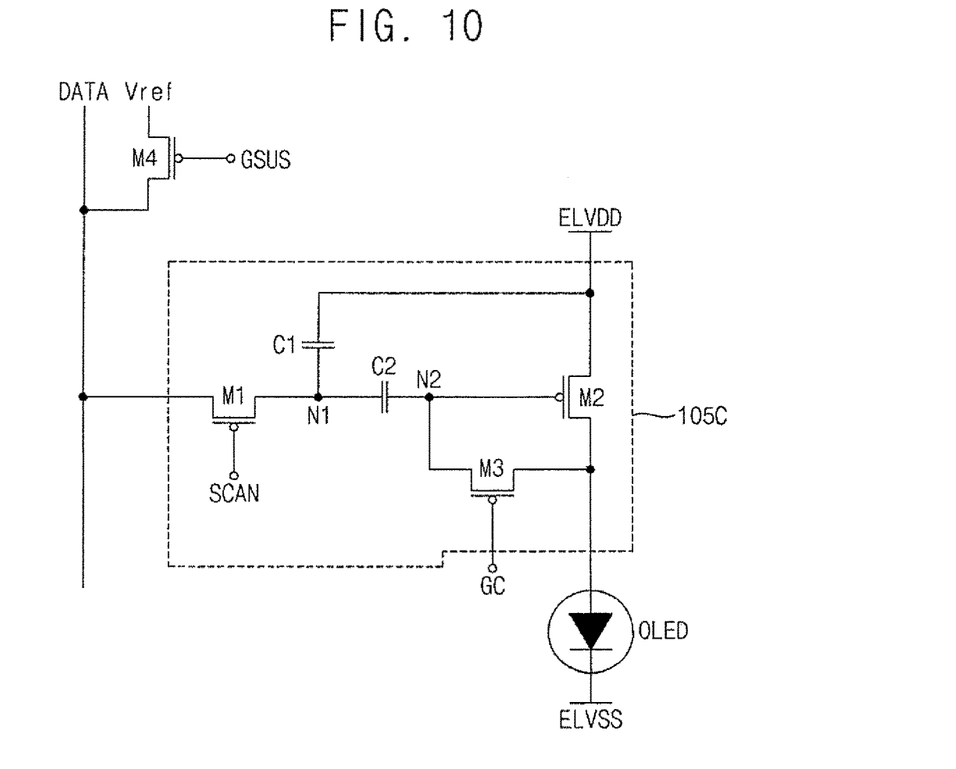
FIG. 10 is a circuit diagram illustrating an example pixel in the display panel of FIG. 8 according to an embodiment of the present invention.

FIG. 10 is a circuit diagram illustrating an example pixel in the display panel of FIG. 8 according to an embodiment of the present invention.

The pixel of FIG. 10 is substantially the same as the pixel described above with reference to FIG. 5 and FIG. 7 except for constructions of a fourth transistor M4 for receiving a reset global signal GSUS. Thus, the same or similar reference numerals will be used to refer to the same or like parts as those described in FIG. 5 and FIG. 7, and duplicate descriptions concerning the above elements may not be repeated.

Referring to FIG. 10, the pixel (or a sub-pixel) may include an OLED and a pixel circuit 105C for providing current to the OLED. In some embodiments, the pixel circuit 105C may include first to fourth transistors M1 to M4 and first and second capacitors C1 and C2.

The third transistor M3 may include a gate electrode connected to a first global signal line, a first electrode connected to the gate electrode of the second transistor M2, and a second electrode connected to the anode of the OLED. Accordingly, a compensation global signal GC (e.g., the first global signal GS1 of FIG. 8) may be supplied to the gate electrode of the third transistor M3. The second transistor M2 may be diode connected when the third transistor M3 is turned on by the compensation global signal GC. Thus, a threshold voltage of the driving transistor (i.e., the second transistor M2) may be compensated by the compensation global signal GC.

The fourth transistor M4 may include a gate electrode connected to a third global signal line, a first electrode to which is supplied a set or predetermined reset voltage or a reference voltage Vref, and a second electrode connected to a data line. A reset global signal GSUS (e.g., the third global signal GS3 of FIG. 8) may be supplied to the gate electrode of the fourth transistor M4. The pixel may be reset when the fourth transistor M4 is turned on during a reset period within a frame.

As described above, the first common line 126 (part of the common line area CL) included in the display panel and the display device may be located between the ESD protection circuit area and the fan-out area FO such that widths W1, W3, and W5 of the first, second, and third transmission lines 124, 144, and 164 that transmit the first, second, and third global signals GS1, GS2, and GS3 from the driving chip to the first, second, and third global signal lines 128, 148, and 168 may be increased. Therefore, line resistance of the first, second, and third transmission lines 124, 144, and 164 may be reduced and the heat and deterioration at the fan-out area FO or the inlets of the display panel may be reduced. Thus, reliability of the display device may be improved.

Embodiments of the present invention may be applied to any display device and any system including the display device. For example, embodiments of the present invention may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The foregoing is illustrative of example embodiments of the present invention, and is not to be construed as limiting thereof. Although a few embodiments have been described, those skilled in the art will readily appreciate that many modifications are possible without materially departing from the novel features and aspects of the present invention. Accordingly, all such modifications are intended to be included within the scope of the present invention as defined in the claims, and their equivalents.

In the claims, means-plus-function clauses are intended to cover the structures described herein as performing the recited function and not only structural equivalents but also equivalent structures. Therefore, it is to be understood that the foregoing is illustrative of example embodiments and the present invention is not to be construed as limited to the specific embodiments disclosed, and that modifications to the disclosed embodiments, as well as other embodiments, are intended to be included within the scope of the appended claims and their equivalents. The present invention is defined by the following claims, with equivalents of the claims to be included therein.

What is claimed is:

1. A display panel comprising:
an electrostatic discharge (ESD) protection circuit area at a side of a peripheral area surrounding a display area comprising a plurality of pixels, the ESD protection circuit area comprising a plurality of ESD protection circuits;
a fan-out area at another side of the peripheral area, comprising a plurality of fan-out lines configured to receive data signals and a first pad configured to receive a first global signal;
a common line area between the ESD protection circuit area and the fan-out area, comprising a first common line extending lengthwise in a first direction;
a first transmission line connecting lengthwise from the first pad to the first common line to transmit the first global signal to the first common line; and
a plurality of first global signal lines extending lengthwise in a second direction crossing the first direction from the first common line and through the ESD protection circuit area to the display area to concurrently transmit the first global signal to the pixels,
wherein a width of the first transmission line is greater than a width of the first global signal lines.

2. The display panel of claim 1, wherein the first global signal lines are arranged to transmit the first global signal to columns of the pixels.

3. The display panel of claim 2, wherein the first direction corresponds to a pixel row direction and the second direction corresponds to a pixel column direction.

4. The display panel of claim 1,
wherein each of the pixels comprises first to third sub-pixels respectively connected to first to third data lines,
wherein each of the fan-out lines is connected to one of the first to third data lines, and
wherein the first to third data lines are configured to respectively transmit the data signals to the first to third sub-pixels of each of the pixels.

5. The display panel of claim 4, wherein
for each of the pixels, one of the first global signal lines is between corresponding ones of the first and second data lines, or
for each of the pixels, one of the first global signal lines is between corresponding ones of the second and third data lines.

6. The display panel of claim 4, wherein for each of the pixels, one of the first global signal lines is adjacent to one of and not between corresponding ones of the first and third data lines.

7. The display panel of claim 1, wherein the first transmission line extends lengthwise in the second direction.

8. The display panel of claim 1,
wherein the fan-out area further comprises a second pad configured to receive a second global signal, and
wherein the common line area further comprises a second common line extending lengthwise in the first direction and configured to receive the second global signal from the second pad.

9. The display panel of claim 8, further comprising:
a second transmission line connecting lengthwise from the second pad to the second common line to transmit the second global signal to the second common line; and
a plurality of second global signal lines extending lengthwise in the second direction from the second common line to the display area to concurrently transmit the second global signal to the pixels,
wherein a width of the second transmission line is greater than a width of the second global signal lines.

10. The display panel of claim 9, wherein the second global signal lines are arranged to transmit the second global signal to columns of the pixels.

11. The display panel of claim 9,
wherein each of the pixels comprises first to third sub-pixels respectively connected to first to third data lines,
wherein each of the fan-out lines is connected to one of the first to third data lines, and wherein the first to third data lines are configured to respectively transmit the data signals to the first to third sub-pixels of each of the pixels.

12. The display panel of claim 11, wherein
for each of the pixels, one of the second global signal lines is between corresponding ones of the first and second data lines, or
for each of the pixels, one of the second global signal lines is between corresponding ones of the second and third data lines.

13. The display panel of claim 11, wherein for each of the pixels, one of the second global signal lines is adjacent to one of and not between corresponding ones of the first and third data lines.

14. The display panel of claim 8,
wherein the first global signal is configured to concurrently control a threshold voltage compensating operation of a driving transistor in each of the pixels, and
wherein the second global signal is configured to concurrently control emission of each of the pixels.

15. A display panel comprising:
an electrostatic discharge (ESD) protection circuit area at a side of a peripheral area surrounding a display area comprising a plurality of pixels, the ESD protection circuit area comprising a plurality of ESD protection circuits;
a fan-out area at another side of the peripheral area, comprising a plurality of fan-out lines configured to receive data signals and to transmit the data signals to a corresponding plurality of data lines extending lengthwise in a second direction, and a pad configured to receive a global signal;
a common line area between the ESD protection circuit area and the fan-out area, comprising:
a first common line extending lengthwise in a first direction crossing the second direction;
a plurality of switching elements each connected to a corresponding one of the data lines;
a second common line extending lengthwise in the first direction and configured to transmit the global signal to the switching elements to concurrently control the switching elements; and
a plurality of global signal lines connecting lengthwise in the second direction from the first common line to the second common line to transmit the global signal to the second common line; and
a transmission line connecting lengthwise from the pad to the first common line to transmit the global signal to the first common line,
wherein a width of the transmission line is greater than a width of the global signal lines and a width of the data lines.

16. The display panel of claim 15, wherein the global signal lines are arranged to correspond to columns of the pixels.

17. The display panel of claim 16, wherein the first direction corresponds to a pixel row direction and the second direction corresponds to a pixel column direction.

18. The display panel of claim 16, wherein the switching elements are located between the first common line and the second common line.

19. The display panel of claim 16,
wherein the global signal is configured to control transmitting of a voltage to the data lines, and
wherein the data lines are configured to transmit the voltage to the pixels to reset the pixels.

20. A display device comprising:
a display panel having a display area comprising a plurality of pixels, and a peripheral area surrounding the display area;
a scan driver configured to provide scan signals to the pixels;
a data driver configured to provide data signals to the pixels;
a control line driver configured to provide a global signal to the pixels; and
a controller configured to control the scan driver, the data driver, and the control line driver,
wherein the peripheral area comprises:
an electrostatic discharge (ESD) protection circuit area at a side of the peripheral area and comprising a plurality of ESD protection circuits;
a fan-out area at another side of the peripheral area, comprising a plurality of fan-out lines configured to receive the data signals and a pad configured to receive the global signal;
a common line area between the ESD protection circuit area and the fan-out area, comprising a common line extending lengthwise in a pixel row direction;
a transmission line connecting lengthwise from the pad to the common line to transmit the global signal to the common line; and
a plurality of global signal lines extending lengthwise in a pixel column direction from the common line and through the ESD protection circuit area to the display area to concurrently transmit the global signal to the pixels, and
wherein a width of the transmission line is greater than a width of the global signal line.

* * * * *